United States Patent [19]

Franke

[11] 4,122,995
[45] Oct. 31, 1978

[54] ASYNCHRONOUS DIGITAL CIRCUIT TESTING SYSTEM

[75] Inventor: Robert H. Franke, Santa Barbara, Calif.

[73] Assignee: Burroughs Corporation, Detroit, Mich.

[21] Appl. No.: 821,118

[22] Filed: Aug. 2, 1977

[51] Int. Cl.² .............................................. G06F 11/00
[52] U.S. Cl. ................... 235/302; 324/73 R
[58] Field of Search ............................ 235/302, 302.2; 307/232; 328/109; 324/73 R

[56] References Cited

U.S. PATENT DOCUMENTS

| | | | |
|---|---|---|---|
| 3,528,017 | 9/1970 | Zussman | 340/146.1 F |
| 3,541,441 | 11/1970 | Hrustich | 235/302.2 |
| 3,636,443 | 1/1972 | Singh et al. | 235/302 |
| 3,740,645 | 6/1973 | Cook | 324/73 R |
| 3,755,747 | 8/1973 | Letoskyy | 328/109 |
| 3,812,426 | 5/1974 | Illian | 235/302 |
| 3,821,645 | 6/1974 | Vinsani | 325/302 |
| 3,976,940 | 8/1976 | Chau et al. | 235/302 |

*Primary Examiner*—Charles E. Atkinson
*Attorney, Agent, or Firm*—Nathan Cass; Kevin R. Peterson; Edward J. Feeney, Jr.

[57] ABSTRACT

Improved means and methods are described for continuously and asynchronously testing the operation of a digital circuit or unit. The testing approach is based on determining whether an output signal from the unit under test is out of skew with a corresponding output from a standard unit for at least an adjustable predetermined minimum time period.

9 Claims, 5 Drawing Figures

ASYNCHRONOUS DIGITAL CIRCUIT TESTING SYSTEM

BACKGROUND OF THE INVENTION

This invention relates generally to improved means and methods for testing the operation of digital circuits such as are employed in digital data processing systems.

As the use of data processing systems continues to increase, it is becoming of increasing importance to provide improved means and methods for testing and diagnosing failures in the various components and circuits of these systems.

A basic known approach for the testing of digital circuits invovles synchronously stimulating a unit to be tested and a standard unit with a desired signal input, and then synchronously comparing the resultant output signal from these units for equality at appropriate times relative to the system clock so as to determine whether the unit being tested is operating properly. Typically, in such synchronous comparison testers, the test signal input must be provided with sufficient setup and hold times relative to clock time, and comparison times must be chosen so as to permit sufficient time for the output signals from the units to have stabilized prior to the occurrence of the clock taking into account the longest permissible propagation delay. One typical known way of meeting these requirements without adding undue complexity is to slow the clock rate, but this has the disadvantage of masking failures which only occur at normal (faster) opeating speeds.

The above described synchronous comparison approach also has the disadvantage of failing to detect certain other types of errors which could also be troublesome during normal system operation. For example, glitches or noise occurring in the output signal of the unit under test at times outside of the comparison time periods would go undetected during testing, and yet could be of significance during normal system operation.

SUMMARY OF THE PRESENT INVENTION

It is accordingly a primary object of the present invention to provide improved means and methods for testing digital circuits so as to permit the detection of a greater number of potential and actual failures than heretofore possible without requiring undue cost and complexity in the testing system.

A more specific object of the invention is to provide improved digital circuit testing means and methods over that provided by the above described synchronous comparison approach.

Another object of the invention is to provide improved means and methods in accordance with one or more of the foregoing objects for continuously testing a digital circuit or unit at normal operating speed.

A further object of the invention is to provide improved means and methods for detecting a potential or actual failure in a digital circuit or unit during normal operation.

Briefly, detection of a potential or actual failure in a digital circuit or unit in accordance with a preferred embodiment of the invention is achieved as follows. First, a standard unit is provided for comparison with the unit to be tested. An appropriately chosen input signal is then concurrently applied to the inputs of both the unit udner test and the standard unit. This input signal could also be the actual signal applied to the unit under test during normal operation thereof in a data processing system. The digital outputs of the unit under test and the standard unit are then continuously and asynchronously compared to determine whether, at any time, a difference occurs (hereinafter referred to as an out of skew condition) between the two outputs for a time period greater than some adjustable predetermined amount. If so, an indication of the ocurrence of this excessive skew condition is provided, and this indication may then be advantageously employed as indicative of a potential or actual failure of the unit under test.

The specific nature of the invention as well as other objects, features, advantages and uses thereof will become apparent from the following detailed description of preferred embodiments taken in conjunction with the accompanying drawings.

DETAILED DESCRIPTION

Like numerals and characters designate like elements throughout the drawings.

Figure 1:
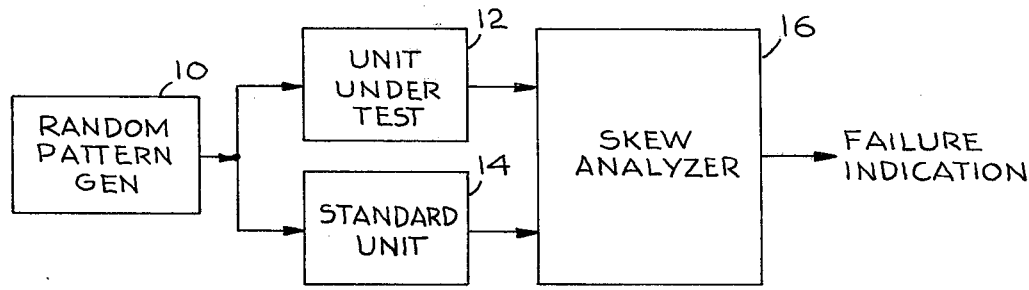
FIG. 1 is an overall block diagram illustrating how the present invention may be employed to test a digital circuit or unit using a test signal input provided by a pattern signal generator.

Referring initially to the overall block diagram of FIG. 1, a pattern generator 10 simultaneously applies a predetermined digital testing pattern as a test input to a digital circuit or unit 12 to be tested and a standard unit 14 to which it is desired that the digital unit conform. The outputs from the digital unit 12 under test and the standard unit 14 are continuously and asynchronously applied to a skew analyzer 16 which is designed in accordance with the present invention to provide a failure indication output whenever the outputs from the unit under test 12 and the standard unit do not properly correspond for an adjustable predetermined time period.

Figure 2:
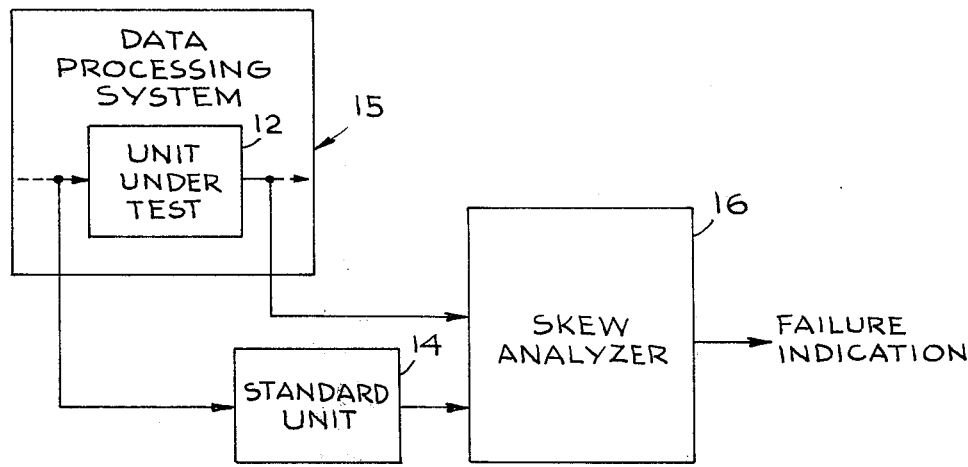
FIG. 2 is an overall block diagram illustrating how the present invention may be employed to test a digital circuit or unit while the unit is in normal operation in a data processing system.

FIG. 2 illustrates an alternative embodiment in which the digital unit 12 is to be tested for potential or actual failure while operating normally in a data processing system 16. In such a case, the input signal applied to the unit under test 12 and the standard unit 14 is the input signal occurring at the input of unit 12 during normal operation in the system.

Figure 4:
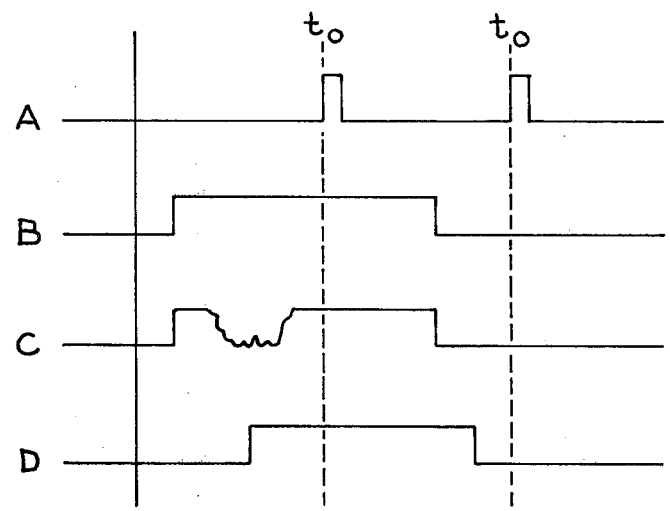
FIG. 4 is a plurality of timing graphs illustrating the operation of a prior art synchronized comparison tester.

Referring next to the timing graphs of FIG. 4, illustrated therein are two potential failure situations which would not be detected by a conventional synchronous comparison tester which compares the outputs of the unit under test and the standard unit only at particular spaced times $t_o$ as indicated by the comparison clock Graph A in FIG. 4. Graph B illustrates the output of a typical standard unit, while Graphs C and D illustrate possible outputs which might be obtained from a unit under test. Graph C illustrates a situation where a break or glitch occurs in the unit under test for a time period other than the comparison $t_o$ time. The output of the unit under test and the output of the standard unit thus appear to correctly compare at each comparison time $t_o$ leaving undetected the glitch indicated in Graph C. Graph D illustrates a situation in which there are unduly long time periods during which the output from the circuit under test (because of propagation variations, for example) does not compare properly with the standard unit output (Graph B). However, because these two outputs properly compare at the comparison times $t_o$, this unduly large skew (which could possibly indicate a potential failure) will go undetected.

Figure 3:
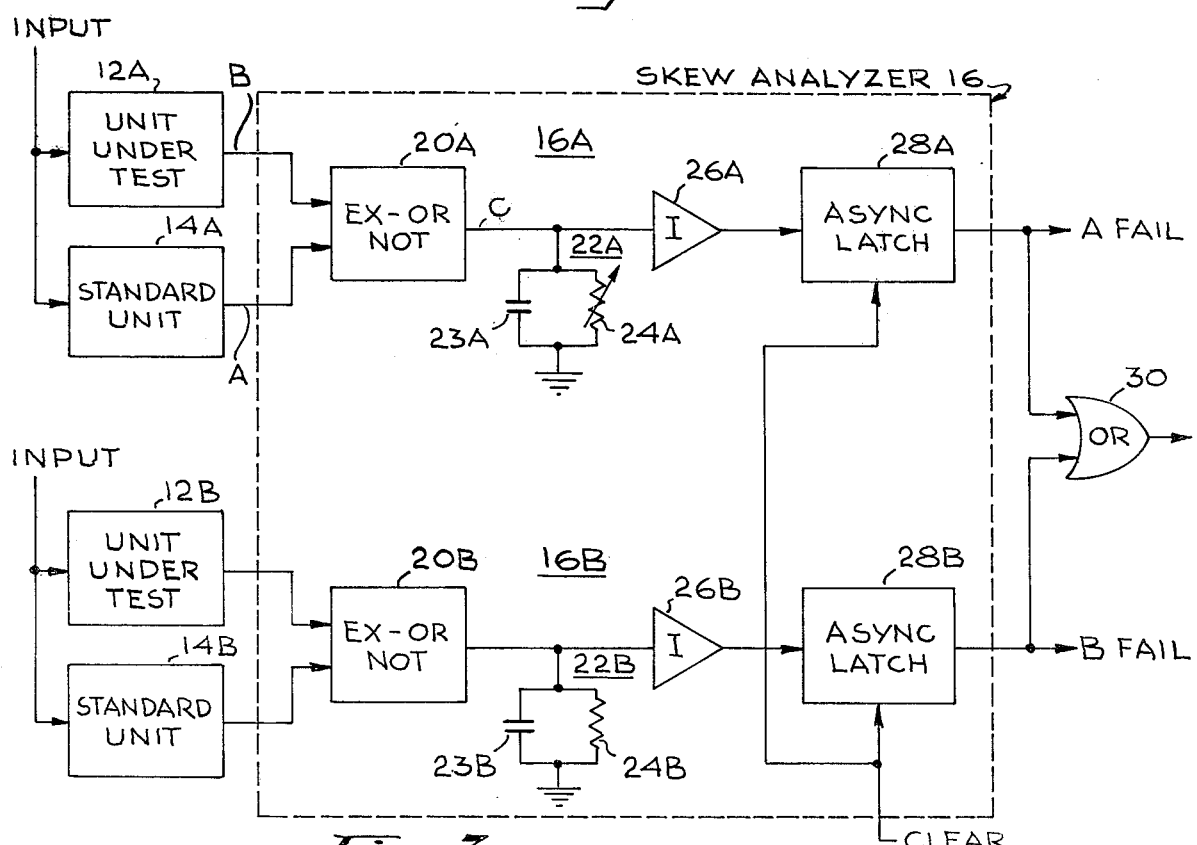
FIG. 3 is an electrical block diagram illustrating a preferred embodiment of a skew analyzer in accordance with the invention.

Referring next to FIG. 3 illustrated therein is a preferred embodiment of the skew analyzer 16 of FIG. 1 which provides for continuously and asynchronously comparing the outputs of the unit under test 12 and the standard unit 14 (FIGS. 1 and 2) so as to advantageously provide for the detection of potential and actual failures, such as illustrated in FIG. 4, as well as other types of failures which heretofore went undetected in previously known testing approaches. Furthermore, as will hereinafter become evident, the asynchronous nature of the skew analyzer 16 permits a more simplified implementation.

The construction and operation of the skew analyzer 16 of FIG. 3 will now be described using the illustrative timing graphs of FIG. 5.

FIG. 3 shows a skew analyzer 16 having a pair of like portions 16A and 16B for concurrently testing two digital units 12A and 12B using respective standard units 14A and 14B. It will be understood that more or less units may be tested by reducing or adding like skew analyzer portions. Accordingly, for the purposes of this description, the construction and operation of only the skew analyzer portion 16A will be described involving digital unit 12A and its respective standard unit 14A, it being understood that the lower skew analyzer portion 16B involving digital unit 12B and its respective standard unit 14B may be constructed to operate in a like manner. For ease of understanding, appropriate signal lines in the skew analyzer portion 16A of FIG. 3 have been designated with A, B, C and D letters corresponding to the lettering of the graphs of FIG. 5.

As shown in FIG. 3, the respective outputs A and B from the unit under test 12A and the standard unit 14A are applied to an Exclusive-Or-Not circuit 20A which provides a true or "1" output only when A and B are both simultaneously true or "1". A typical output A from standard unit 14A is illustrated by graph A of FIG. 5, while three possible outputs from the unit under test 14 are illustrated by graphs $B_1$, $B_2$ and $B_3$ in FIG. 5. The respective resulting output from the Exclusive-Or-Not circuit 20A for each of these $B_1$, $B_2$ and $B_3$ outputs from the unit under test are illustrated by graphs $C_1$, $C_2$ and $C_3$ in FIG. 5. It will be evident from these graphs $C_1$, $C_2$ and $C_3$ that the Exclusive-Or-Not circuit provides an output pulse whose duration is a direct measure of the time period for which the outputs of the unit under test 12A and the standard unit 14A are not the same, that is, are out of skew. Each of the Exclusive-Or-Not circuits 20A and 20B in FIG. 3 may, for example, be implemented using a Fairchild/-CTL 9822 Dual Full Adder/Subtractor operated in the subtract mode.

Figure 5:
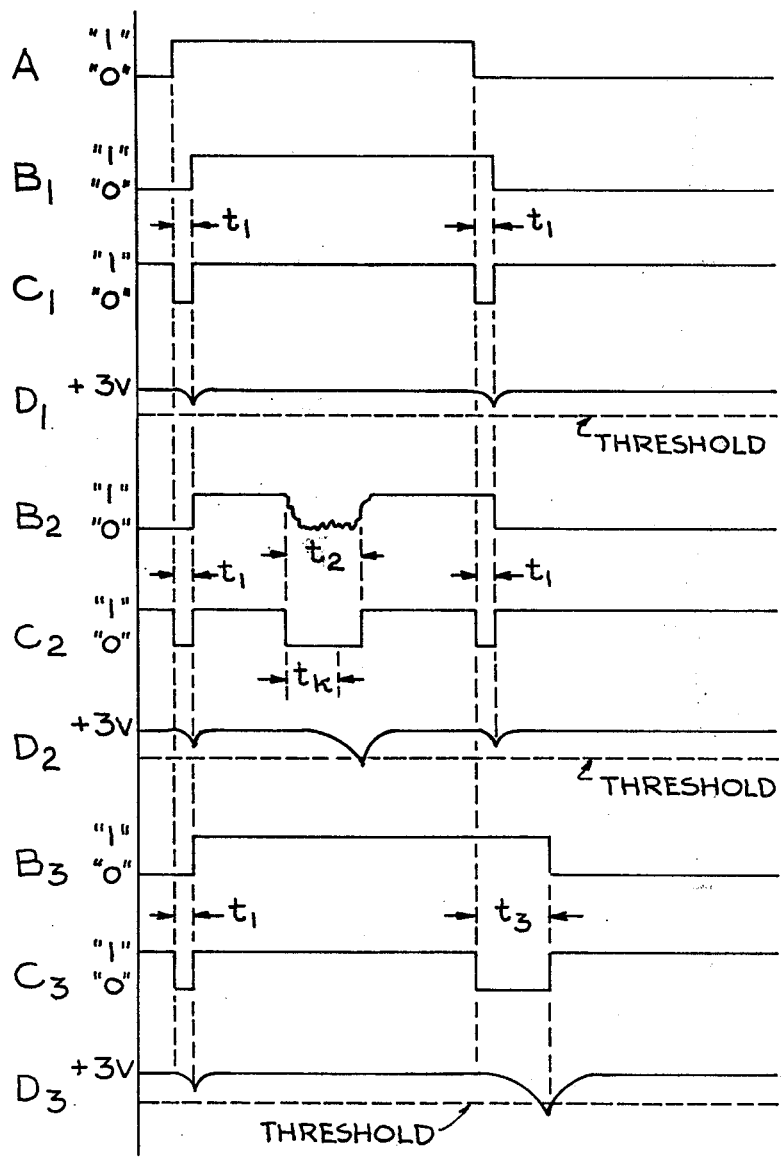
FIG. 5 is a plurality of timing graphs illustrating the operation of the skew analyzer of FIG. 3.

As shown in FIG. 3, the output of the Exclusive-Or-Not circuit 20A is applied to an integrating circuit 22A comprised of a capacitor 23A and an adjustable resistor 24A connected in parallel, the resulting output signal from this integrator for each of the units under test outputs $B_1$, $B_2$ and $B_3$ being illustrated by graphs $D_1$, $D_2$ and $D_3$, respectively, in FIG. 5.

It will be understood from graphs $D_1$, $D_2$ and $D_3$ in FIG. 5 that integrating circuit 22A provides an output signal D which remains at a "1" or true voltage level (which may, for example, be +3 volts) so long as the A and B outputs of the unit under test 12A and the standard unit 14A are both "1" or true. However, when the A and B outputs are different (as indicated by the pulses in graphs $C_1$, $C_2$ and $C_3$), the true or "1" voltage level of integrating circuit 22A will decay towards the "0" or false voltage level (which may, for example, be 0 volts), the decay being greater the longer the time period that the outputs A and B remain different, that is, out of skew. Typically, capacitor 23A may be 100 picofarads and resistor 24A may be 200 ohms providing a 20 nanosecond time constant.

The output D of integrating circuit 22A in FIG. 3 is applied to an inverter 26A which may, for example, be implemented using a Fairchild CTL 9806 Inverter having a switching threshold of 0.8 volts. Accordingly, the 20 nanosecond time constant provided by integrating circuit 22A will result in its output D decaying below the +0.8 volt threshold level of inverter 26A in 20 nanoseconds. The inverter output D will then become true or "1" to set an asynchronous latch 28A to which the output of inverter 26A is applied, the resulting true or "1" output of asynchronous latch 28A thereby constituting a failure indication for the unit under test 12A. Asynchronous latches 28A and 28B in FIG. 3 may, for example, be implemented using a Fairchild CTL 9834 Quad Latch.

As illustrated in FIG. 3, the outputs of asynchronous latches 28A and 28B may be applied to an OR gate 30 for providing an output indicating that one or more of the units under test 12A and 12B have failed.

Each of the particular outputs $B_1$, $B_2$ and $B_3$ (FIG. 5) which may be provided by the circuit under test 12A (FIG. 3) will now be more specifically considered. Graph $B_1$ in FIG. 5 illustrates an acceptable out of skew time period $t_1$ between $B_1$ and the standard unit output A for which the output of integrating circuit 22A is less than the time constant period $t_k$ provided by integrating circuit 22A. Thus, as shown by graph $D_1$, the output of integrating circuit 22A does not decay to the threshold level of inverter 26A.

Graph $B_2$ in FIG. 5 illustrates an output from the unit under test 12A which is similar to the $B_1$ output, except having a break or glitch which produces an out of skew condition for an unacceptable time period $t_2$ which is greater than the time constant period $t_k$ of integrating circuit 22A. As a result, the output of integrating circuit 22A falls below the threshold of inverter 26A, as illustrated by graph $D_2$ in FIG. 5, thereby causing asynchronous latch 28A to be set to indicate a failure in the unit under test 12A.

Lastly, graph $B_3$ in FIG. 5 illustrates an output from the unit under test 12A (FIG. 3) which is out of skew with the standard unit output A for an unacceptable time period $t_3$ that is greater than the integrating circuit time constant $t_k$, thereby causing (as illustrated in graph $C_3$) the integrating circuit output to fall below the threshold of inverter 24A, as also occurs for output $B_1$, thus again resulting in the setting of asynchronous latch 28A to indicate a failure in the unit under test 12A.

It is to be understood that the present invention is not limited to the preferred embodiments disclosed herein, and that many modifications in construction, arrangement, use and operation are possible within the true spirit of the invention. The present invention is accordingly to be considered as including all such modifications and variations coming within the scope of the appended claims.

What is claimed is:

1. Means for testing a digital unit comprising:
    a standard unit to which it is desired that said digital unit conform;
    digital signal input means for concurrently applying a test input signal to said digital unit and to said standard unit;
    skew analyzer means to which the outputs of said digital unit and said standard unit are continuously and asynchronously applied, said skew analyzer means being operative to determine when the outputs of said units are out of skew for a time greater than an adjustable predetermined minimum time period; and
    indicating means responsive to the determination by said skew analyzer means of an out of skew condition for at least said predetermined minimum time period for providing an output signal indicative of a potential or actual failure of said digital unit.

2. The invention in accordance with claim 1, wherein said digital signal input means is a pattern generator.

3. The invention in accordance with claim 1, wherein said digital unit is connected for normal operation in a digital data processing system; and wherein said test input signal is the input signal applied to said digital unit during normal operation thereof in said digital data processing system.

4. A method for testing the operation of a digital unit with respect to a standard unit to which it is desired that said digital unit conform, said method comprising:
    concurrently applying a test input signal to said digital unit and said standard unit;
    continuously and asynchronously detecting the skew relationship of the outputs of said digital unit and said standard unit;
    continuously generating an out of skew signal representing the time period for which the outputs of said units are out of skew;
    establishing a permitted maximum out of skew time period; and
    producing an indication of potential or actual failure of said digital unit in response to said out of skew signal indicating that the outputs of said digital unit and said standard unit have been out of skew for at least said permitted maximum out of skew time period.

5. Means for testing a digital unit comprising:
    a standard unit to which it is desired that said digital unit conform;
    digital signal input means for concurrently applying a test input signal to said digital unit and to said standard unit;
    skew analyzer means to which the outputs of said digital unit and said standard unit are continuously and asynchronously applied, said skew analyzer means being operative to determine when the outputs of said units are out of skew for a time greater than a predetermined minimum time period; and
    indicating means responsive to the determination by said skew analyzer means of an out of skew condition for at least said predetermined minimum time period for providing an output signal indicative of a potential or actual failure of said digital unit;
    said skew analyzer means including:
    logical circuit means to which the outputs of said units are concurrently, continuously and asynchronously applied, said logical circuit means providing a binary digital output of one binary value when the outputs of said digital unit and said standard unit are the same and a binary digital output of the other binary output when the outputs of said units are different;
    integrating circuit means to which the output of said logical circuit means is applied for providing an output signal whose amplitude is indicative of the period of time that the outputs of said digital unit and said standard unit are out of skew; and
    threshold sensitive means to which the output of said integrating circuit is applied, said threshold sensitive means being operative to switch in response to the output of said integrating circuit means reaching an amplitude indicative of said units being out of skew for said predetermined minimum time period, the output of said threshold sensitive circuit being applied to said indicating means as a determination that an out of skew condition between said units has occurred for at least said minimum predetermined time period.

6. The invention in accordance with claim 5, wherein said integrating circuit means provides an adjustable time constant.

7. The invention in accordance with claim 5, wherein said logical circuit means is an Exclusive-Or-Not circuit.

8. The invention in accordance with claim 7, wherein said indicating means comprises an asynchronous latch which is set in response to the switching of said threshold sensitive means.

9. A method for testing the operation of a digital unit with respect to a standard unit to which it is desired that said digital unit conform, said method comprising:
    concurrently applying a test input signal to said digital unit and said standard unit;
    continuously and asynchronously detecting the skew relationship of the outputs of said digital unit and said standard unit; and
    producing an indication of potential or actual failure of said digital unit in response to the outputs of said digital unit and said standard unit being out of skew for at least a predetermined period of time, said step of producing including:
    generating a binary digital signal having one binary value when the outputs of said digital unit and said standard unit are the same and a binary digital signal having the other binary value when said units are out of skew;
    integrating said binary digital signal to produce an integrated signal having an amplitude which is indicative of the time period for which the outputs of said units are out of skew; and
    generating a failure indicating signal when said integrated signal reaches a predetermined amplitude threshold value.

* * * * *